United States Patent

Tsao et al.

[11] Patent Number: 6,165,279
[45] Date of Patent: Dec. 26, 2000

[54] METHOD FOR CLEANING A SEMICONDUCTOR WAFER

[75] Inventors: Li-Wu Tsao, Keelung; Cheng-Chieh Huang, Taipei Hsien; Tse-Wei Liu, Hsinchu, all of Taiwan

[73] Assignee: United Silicon Incorporated, Hsinchu, Taiwan

[21] Appl. No.: 09/215,586

[22] Filed: Dec. 17, 1998

[30] Foreign Application Priority Data

Oct. 14, 1998 [TW] Taiwan ................................. 87117023

[51] Int. Cl.[7] ........................................................ C23G 1/02
[52] U.S. Cl. .............................. 134/3; 134/25.4; 134/26; 134/28; 134/29; 134/30; 134/34; 134/36; 134/37; 134/40; 134/41; 134/42; 134/902; 134/2
[58] Field of Search ................................. 134/2, 3, 25.4, 134/26, 28, 29, 30, 34, 36, 37, 40, 42, 902, 41

[56] References Cited

U.S. PATENT DOCUMENTS

| | | | |
|---|---|---|---|
| 5,470,393 | 11/1995 | Fukazawa | 134/26 |
| 5,679,171 | 10/1997 | Saga et al. | 134/2 |
| 5,810,940 | 9/1998 | Fukazawa et al. | 134/3 |
| 5,938,857 | 8/1999 | Fugiwara et al. | 134/2 |
| 5,944,907 | 8/1999 | Ohmi | 134/1.3 |

*Primary Examiner*—S. Carrillo
*Attorney, Agent, or Firm*—J. C. Patents; Jiawei Huang

[57] ABSTRACT

A method for cleaning a semiconductor wafer which includes the sequential steps of cleaning the wafer in a dilute hydrofluoric acid bath, cleaning the wafer in a first ozone bath, cleaning the wafer in a dilute hydrofluoric acid/hydrogen peroxide/hydrogen chloride bath, followed by cleaning the wafer in a second ozone bath. The method uses the dilute hydrofluoric acid/hydrogen peroxide/hydrochloric acid bath instead of the conventional DHF bath and RCA2 bath. Hence, the amount of chemicals consumed and the number of baths used by the cleaning station are lowered. In addition, ozone is passed into an overflow loath so that the highly reactive ozone can be utilized to clean the wafer without putting additional load on the cleaning station. Therefore, the cleaning operation can be carried out in a smaller cleaning station using somewhat lower temperature and lower concentration chemical solutions. The efficiency is as high as a multi-bath station, but chemicals are not wasted. Furthermore, the throughput is high and stable without causing too many safety and environmental problems.

11 Claims, 3 Drawing Sheets

METHOD FOR CLEANING A SEMICONDUCTOR WAFER

BACKGROUND OF THE INVENTION

1. Field of Invention

The present invention relates to a method for cleaning a semiconductor wafer. More particularly, the present invention relates to a method for cleaning a semiconductol wafer that uses multiple baths and requires the minimum number of low temperature, low concentration chemicals to carry out the cleaning operation.

2. Description of Related Art

In the manufacturing of integrated circuit devices on a silicon wafer, cleaning operations are normally carried out both before and after a chemical operation, for example, a chemical vapor deposition, a dry or a wet etching operation. The purpose of such cleaning is to remove any organic or inorganic particles that are attached to the wafer surface. As the level of integration continues to increase, size of each device has shrunk to just a few microns. Therefore, any particles left on an unclean wafer surface can tremendously affect the finish quality in subsequent operations. If wafer cleaning operations are carried out inappropriately, the following problems may emerge:

1. Surface roughness of a silicon wafer may increase. Subsequently, when an oxide layer is formed over a silicon substrate, voids or crevices may form at the interface between the two layers. These voids trap and accumulate charged particles quite readily, leading to the formation of high-density residual charges (Dit) at the interface.

2. Residual impurities may also be attached to the surface of the wafer or trapped similarly inside the voids. These residual impurities can be quite easily transformed into charged ions. These charged ions diffuse inside the oxide layer, generating mobile charges (Qm).

The appearance of residual charges (Dit) and mobile charges (Qm) not only increase the leakage current, but also lead to the lowering of both the breakdown voltage (Vbd) and the breakdown charge (Qbd).

3. Any residual iron (Fe) or nickel (Ni) particles on the wafer surface tends to increase the amount of metal inside the gate oxide layer above. An increase in the metal content within the gate oxide layer leads to the lowering of surface recombination lifetime (SRL) as well as the bulk recombination lifetime (BRL). Moreover, the gate-oxide breakdown voltage (BvGox) of the gate oxide layer are lowered as well.

Consequently, if a given wafer cleaning process retains some of the unwanted particles on the surface, quality and reliability of the finished semiconductor devices may deteriorate.

FIG. 1 is a flow diagram showing the series of steps in a conventional multi-bath wafer cleaning method that prepares the wafer surface for gate oxide deposition. Here, a multiple-bath station is used. First, the silicon wafer is placed inside a dilute hydrofluoric acid (DHF) bath 110 so that sacrificial oxide above the wafer is removed. Then, the wafer is transferred to an overflow (OF) bath 112 to remove any residual DHF acid on the wafer. Thereafter, the wafer is washed inside an RCA1 cleaning bath 114 using RCA1 solution. The RCA1 solution is a mixture containing ammonium hydroxide ($NH_4OH$), de-onized water (HDIW) and hydrogen peroxide ($H_2O_2$). The RCA1 solution is heated to about 40° C. to 70° C. to remove organic particles from the surface of the wafer.

Next, the silicon wafer is placed in a hot, quick-dump rinse (HQDR) bath 116 to remove residual RCA1 solution using a large quantity of de-ionized water. Then, the wafer is placed inside another dilute hydrofluoric acid (DHF) bath 118 to remove native oxide.

Thereafter, the wafer is placed inside another overflow (OF) bath 120 to remove any residual DHF acid. Then, the wafer is washed in an RCA2 cleaning bath 122 using RCA2 solution. The RCA2 solution is a mixture containing hydrochloric acid (HCl), hot de-ionized water (HDIW) and hydrogen peroxide ($H_2O_2$). The RCA2 solution is heated to about 40° C. to 80° C. to remove metallic impurities and particles from the surface of the wafer.

In the subsequent step, the wafer is placed inside another HQDR bath 124 to remove residual RCA2 solution using a large quantity of de-ionized water. Next, the wafer is placed inside a final rinse (FR) bath 126 wherein the wafer is further cleaned.

Finally, the wafer is placed inside a de-moisturizing bath 128 containing isopropyl alcohol (IPA). Inside the bath 128, moisture on the wafer surface is carried away by the IPA vapor, thereby obtaining a clean, dry surface.

In the above-mentioned method, a batch of silicon wafers are moved from one cleaning bath to another until the whole cleaning process is complete. The advantage of such method is the capacity for each bath to work independently. If any one of the baths is polluted, only the batch of wafers in that particular batch are affected. Therefore, the problem bath can be fixed without having to shut down the whole cleaning station. However, the entire cleaning operation involves many steps (a total of ten as shown in FIG. 1) and each step requires a cleaning bath hence a lot of space is needed to accommodate these baths. Furthermore, temperature and concentration of the chemical solution in these baths are generally high, and the kind of chemicals employed in the cleaning process are many. Consequently, a large sum of money has to be spent on the design and maintenance of the cleaning station not to mention the charges for polluting the environment and other safety considerations. To minimize the defects of a multi-bath design, an improved cleaning station using just a single bath has been developed.

FIG. 2 is a flow diagram showing the series of steps carried out in a single bath wafer cleaning station. Here, only a single cleaning bath 210 is used. All the cleaning steps are carried out within this cleaning bath 210. First, the silicon wafer is placed inside the cleaning bath 210 and then dilute hydrofluoric (DHF) acid is poured into the bath 210 for removing sacrificial layers above the wafer. Thereafter, de-ionized water is pumped into the bath 210, and then the de-ionized water is permitted to overflow so that any residual DHF acid is carried away. Next, RCA1 solution is pumped into the bath 210 to clear away any organic particles on the surface of the wafer. In the subsequent step, using a hot, quick-dump rinse (HQDR) method, a large quantity of de-ionized water is pumped into the bath 210 for rapidly removing residual RCA1 solution on the wafer. After that, ozone ($O_3$) is passed through the bath to remove organic or metallic impurities. Next, dilute hydrofluoric (DHF) acid may be added to the bath 210 if native oxide needs to be removed from the wafer, as well.

Thereafter, an overflow (OF) method using de-ionized water is carried out to remove any residual DHF acid on the wafer. Then, a final rinse is conducted to clean the wafer further. Finally, isopropyl alcohol (IPA) is pumped into the bath 210 so that the IPA vapor can carry any moisture away, further drying the wafer.

The single bath method for wafer cleaning has several advantages. Firstly, the cleaning station occupies a rather small foot-print. Secondly, design and material cost of such a station is smaller. Thirdly, in each cleaning operation, fresh, new, chemical solution is pumped in and hence the process is able to maintain a high level of chemical activity. In addition, proper cleaning can be achieved with a somewhat low temperature, low concentration, chemical solution.

However, since fresh chemical solution has to be added at the start of each cleaning operation, a lot of chemicals and de-ionized water are wasted. Moreover, batch mode of production is employed in a single bath cleaning station. In other words, a batch of silicon wafers is put inside the single bath to carry out the series of chemical cleaning operations. The batch of wafers remains inside the bath until the series of cleaning steps have all been completed. Therefore, there is very little tolerance for errors because the entire batch of wafers may have to be scrapped. Furthermore, as the number of steps required for cleaning a batch of wafers increases, operation of the cleaning station is too complicated to lose throughput very much. Moreover, if the bath is polluted, the entire cleaning station has to be shut down, adding difficulties in recovery the entire system.

In light of the foregoing there is a need to improve the method for cleaning semiconductor wafers.

SUMMARY OF THE INVENTION

Accordingly, the present invention provides a method for cleaning semiconductor wafers that uses a multi-bath type of station and requires the minimum number of low temperature, low concentration chemicals to carry out the cleaning operations. In fact, the method combines the advantages of both the single bath and the multi-bath cleaning stations. In other words, the cleaning operation can be carried out in a cleaning station using low temperature, low concentration chemical solutions without occupying too much area. The efficiency is as high as a multi-bath station, but chemicals and de-ionized water are not wasted. Furthermore, the throughput is high and stable without causing too many safety and environmental problems.

To achieve these and other advantages and in accordance with the purpose of the inventions, as embodied and broadly described herein, the invention provides a method for cleaning semiconductor wafer. The method uses a dilute hydrofluoric acid/hydrogen peroxide/hydrochloric acid (DHF/ $H_2O_2$/HCl) bath instead of the conventional DHF bath and RCA2 bath. Hence, the amount of chemicals consumed and the number of baths used by the cleaning station are lowered. In addition, ozone is passed into the overflow (OF) bath so that the high reacting activity of ozone can be recruited for cleaning the wafer without putting on additional load to the cleaning station.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
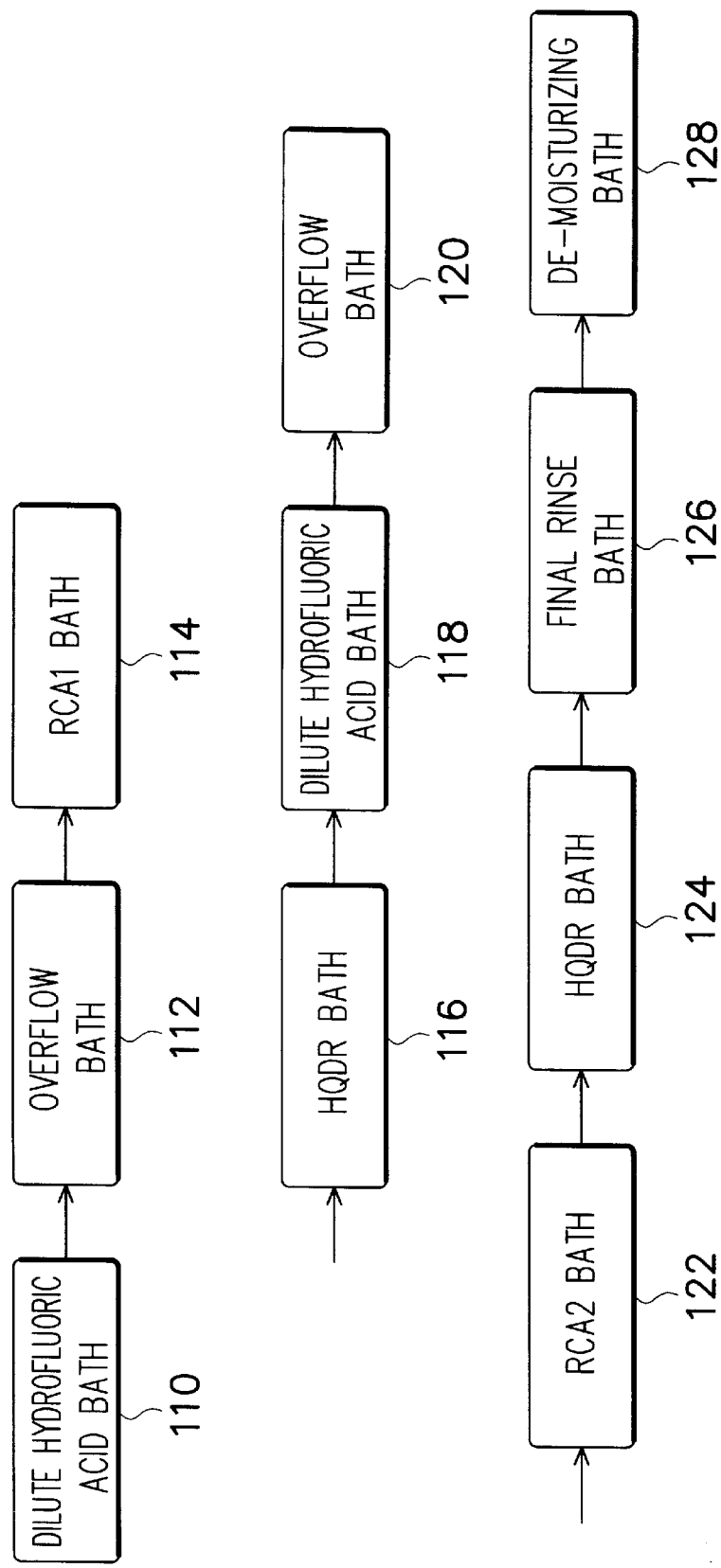
FIG. 1 is a flow diagram showing the series of steps in a conventional multi-bath wafer cleaning method that prepares the wafer surface for gate oxide deposition.
Figure 2:
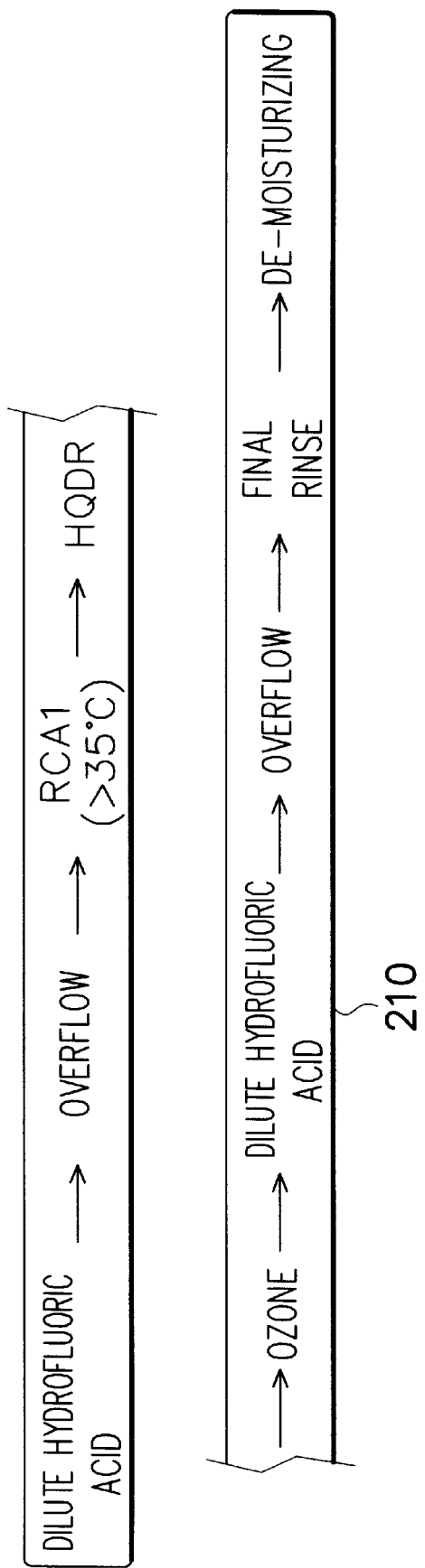
FIG. 2 is a flow diagram showing the series of steps carried out in a conventional single bath wafer cleaning station.

Reference will now be made in detail to the present preferred embodiments of the invention, examples of which are illustrated in the accompanying drawings. Wherever possible, the same reference numbers are used in the drawings and the description to refer to the same or like parts.

Figure 3:
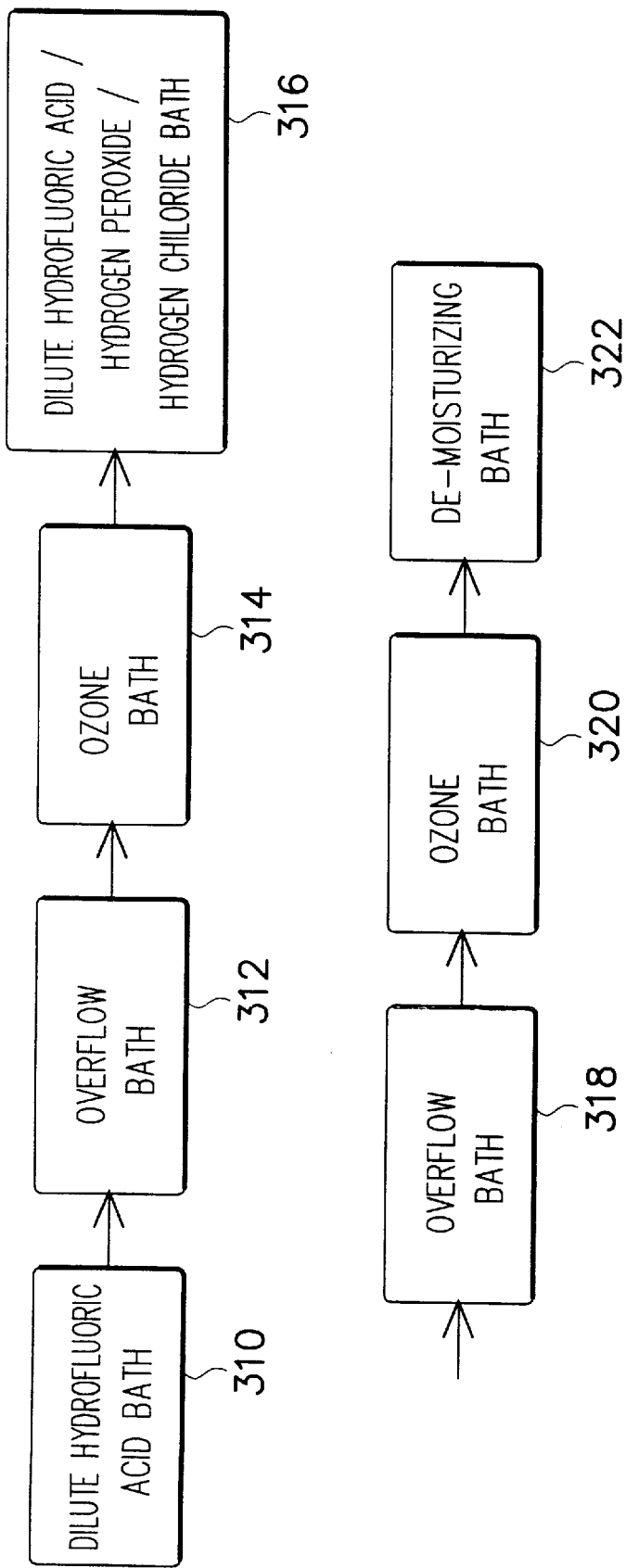
FIG. 3 is a flow diagram showing the series of steps carried out in a multi-bath wafer cleaning method according to one preferred embodiment of this invention.

FIG. 3 is a flow diagram showing the series of steps carried out in a multi-bath water cleaning method according to one preferred embodiment of this invention. First, the silicon water is placed inside a dilute hydrofluoric (DHF) acid bath 310 to carry out an initial cleaning operation. The DHF acid serves to remove impurities on the wafer such as sacrificial oxide. Normally, the DHF acid solution in the bath 310 is maintained at a temperature of between about 20° C. and 30° C., and preferably between about 20° C. to 25° C., for example, at 22° C. Thereafter, the wafer is transferred to an overflow (OF) bath 312 where any residual DHF acid is removed. Subsequently, the wafer is placed inside an ozone bath 314, where ozone is passed into de-ionized water within the ozone bath 314 to form an ozone solution. The ozone solution in the bath 314 is maintained at a temperature of between about 20° C. to 30° C., and preferably about 25° C. The ozone solution is used to remove metallic or organic particles on the wafer.

Thereafter, the wafer is placed inside a dilute hydrofluoric acid/hydrogen peroxide/hydrochloric acid (DHF/$H_2O_2$/HCl) bath 316 for further cleaning. The ratio of the chemicals DHF/$H_2O_2$/HCl inside the bath 316, for example, can be about 0.5:1:1 to 0.1:5:5. The bath 316 is maintained at a temperature between about 20° to 30° C. (for example, at about 22° C.) for removing metallic impurities and any native oxide that happens to form on the wafer surface during previous cleaning operations.

The wafer is transferred to an overflow (OF) bath 318 where the residual DHF/$H_2O_2$/HCl solution is removed. Subsequently, the wafer is transferred to another ozone bath 320, where ozone is passed into the de-ionized water within the ozone bath 320 to form an ozone solution. The ozone solution in the bath 320 is maintained between about 20° C., and preferably about 25° C. The ozone solution is used to remove metallic or organic particles on the wafer.

The wafer is placed inside a de-moisturizing bath 322 containing isopropyl alcohol (IPA). Inside the bath 322 moisture on the wafer surface is carried away by the IPA vapor, thereby obtaining a clean dry surface.

In the above embodiment, a dilute hydrofluoric acid/ hydrogen peroxide/hydrochloric acid (DHF/$H_2O_2$/HCl) bath 316 is used instead of the conventional DHF bath and RCA2 bath. Ozone solution inside the ozone bath 320 is formed by passing ozone through the de-ionized water. The ozone solution in the bath 314 is maintained at a temperature of between about 20° C. and 30° C. Since ozone solution has a high activity for oxidizing organic or metallic impurities over a silicon wafer, these impurities can be removed quite easily. After oxidation, these oxidized impurities are carried away by the water to form a very clean surface. Therefore, using an ozone solution cleans the wafer without having to use hot and concentrated chemical solution.

In the embodiment of this invention, only seven baths are needed instead of the ten as in the conventional multi-bath cleaning method. Therefore, much less area is occupied. Additionally productivity of the invention is much better than the single bath type.

Furthermore, since ozone is passed directly into the de-ionized water in the ozone bath 314, the ozone bath 314 can be further combined with the overflow bath 312 thereby saving some more space. The method includes directly passing ozone solution into the overflow bath 312 so that ozone within the ozone solution can react with metallic and organic particles on the wafer surface. At the same time, the reacted impurities can be carried away by the water flowing into the overflow bath 312. Similarly, the ozone bath 320 and the overflow bath 318 can be combined together.

To compare the differences between using a conventional wafer cleaning operation and the wafer cleaning method of this invention, Tables 1, 2 and 3 list some of the measurements carried out during the process of fabricating a DRAM product. In table 1, roughness, iron and nickel content for a blank piece of wafer is given in columns one to three. After a gate oxide layer is formed over the blank wafer, the measured amount of mobile charges (Qm) and residual charges (Dit) are shown in column four and five in Table 1. The measured results of leakage current, surface recombination lifetime and bulk recombination lifetime are listed in columns one to three in Table 2. Thereafter, a polysilicon layer is deposited over the gate oxide layer, and the resulting breakdown charge (Qbd) and breakdown voltage (Vbd) are listed in columns four and five in Table 2. On the other hand, as the DRAM device is finally built, gate-oxide breakdown voltages (BvGoxNW and BvGoxPW) are listed in the two columns in Table 3. In Tables 1, 2 and 3, label A refers to a wafer that has gone through the series of wafer cleaning steps as shown in FIG. 3, while label B refers to a wafer that has gone through the series of conventional wafer cleaning steps as shown in FIG. 1. Nomenclature and symbols used in Tables 1, 2 and 3 are also listed in detail below the tables.

According to the measurement results shown in Tables 1, 2 and 3, cleaning a wafer with method A produces a surface having a less roughness and a lesser amount of nickel (Ni) than cleaning a wafer with method B. Only the final amount of residual iron (Fe) on the wafer is slightly higher for method A than for method B, but the amount of increase is no more than 1%. The measured residual charges (Dit), mobile charges (Qm) and leakage are smaller when a wafer is cleaned using method A instead of method B, which indicates a cleaner interface between the silicon and the gate oxide layer above. Moreover, the measured gate-oxide recombination lifetime is higher when a wafer is cleaned using method A instead of method B, indicating that the gate oxide layer contains fewer impurities.

In addition, the breakdown voltage (Vbd), the breakdown charge (Qbd) and the gate-oxide breakdown voltage (BvGoxNW and BvGoxPW) are higher for a wafer cleaned using method A than for a water cleaned using method B. NW represents an N-type semiconductor substrate while PW represents a P-type semiconductor substrate.

TABLE 1

| | | Blank Wafer | | Blank Wafer + Gate Oxide Layer | |
| --- | --- | --- | --- | --- | --- |
| | Roughness | Iron (Fe) content | Nickel (Ni) content | Qm | Dit |
| A | 1.55 A | 5.35e10 | 4.16e10 | 3.54e10 | 7.17e10 |
| B | 1.77 A | 5.30e10 | 4.88e10 | 4.46e10 | 8.25e10 |
| Measuring Instrument | AFM | TXRF | | QUANTOX | |

TABLE 2

| | Blank Wafer + Gate Oxide Layer | | | Blank Wafer + Gate Oxide Layer + Polysilicon Layer | |
| --- | --- | --- | --- | --- | --- |
| | Leakage | SRL | BRL | Vbd | Qbd |
| A | 5.28e16 | 369 | 1180 | 14.58 | 21.11 |
| B | 1.55e17 | 311 | 1040 | 14.39 | 20.00 |
| Measuring Instrument | QUANTOX | | | Qbd | |

TABLE 3

| | DRAM Product | |
| --- | --- | --- |
| | BvGoxNW | BvGoxPW |
| A | 11.39 | 11.98 |
| B | 11.28 | 11.96 |
| Measuring Instrument | WAT | |

A: DHF→OF→Ozone→DHF/$H_2O_2$/HCl→OF→Ozone→IPA

B: DHF→OF→RCA1(70° C.)→HQDR→DHF→OF→RCA2(80° C.)→HQDR→FR→IPA

AFM: Atomic Force Microscope
QUANTOX: Oxide Monitoring System
WAT: Water Acceptance Test
SRL: Surface Recombination Lifetime ($\mu$sec)
BRL: Bulk Recombination Lifetime ($\mu$sec)
Leakage: Leakage Current (A)
Dit: Residual charges (ions/eV/$cm^2$)
Qm: mobile charges (ions/$cm^2$)
Vbd: Breakdown Voltage (Volts)
Qbd: Breakdown Charges (Coul)
BvGoxNW: N-well Gate-oxide Breakdown Voltage
BvGoxPW: P-well Gate-oxide Breakdown Voltage In summary, wafer cleaning method A is able to produce much cleaner wafer surfaces and better electrical properties than the conventional wafer cleaning method B. Further advantages of the invention includes:

1. By replacing the conventional RCA1 bath with the ozone bath, and replacing the conventional DHF bath and the RCA2 bath with a dilute hydrofluoric acid/hydrogen peroxide/hydrochloric acid (DHF/$H_2O_2$/HCl) bath, the number of cleaning baths necessary for carrying out the wafer cleaning operation is reduced. Therefore, the cleaning station occupies less space, as does the single-bath cleaning station, but at the same time is able to maintain a high and stable level of throughput similar to a multi-bath cleaning station.

2. Since highly reactive ozone is used in one of the cleaning baths, wafer cleaning can be conducted using lower concentration chemicals at a lower temperature. Therefore, it is easier to meet industrial safety standard and emits less pollutants to the environment.

3. The multi-bath type of cleaning operation not only can save chemicals and de-ionized water, but production can also be quite stable, as well.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for cleaning a semiconductor wafer, comprising the sequential steps of:

cleaning the semiconductor wafer in a dilute hydrofluoric acid bath;

cleaning the semiconductor wafer in a first ozone bath;

cleaning the semiconductor wafer in a dilute hydrofluoric acid/hydrogen peroxide/hydrogen chloride bath; and cleaning the semiconductor wafer in a second ozone bath.

2. The cleaning method of claim 1, wherein all of the sequential cleaning steps are conducted at a temperature of between about 20° C. and 30° C.

3. The cleaning method of claim 1, wherein the step of cleaning the semiconductor wafer in the dilute hydrofluoric acid bath is conducted at a temperature of between about 20° C. and 25° C.

4. The cleaning method of claim 1, wherein the step of cleaning the semiconductor wafer in the first ozone bath is conducted at a temperature of about 25° C.

5. The cleaning method of claim 1, wherein the steps of cleaning the semiconductor wafer in the second ozone bath is conducted at a temperature of about 25° C.

6. The cleaning method of claim 1, wherein the steps of cleaning the semiconductor wafer in the first ozone bath and the second ozone bath includes passing ozone into a pool of de-ionized water to form an ozone solution.

7. The cleaning method of claim 1, wherein after the step of the semiconductor wafer cleaning in the dilute hydrofluoric acid bath but before the step of cleaning the semiconductor wafer in the first ozone bath, the semiconductor wafer is transferred to a first overflow bath for further cleaning.

8. The cleaning method of claim 1, wherein after the step of cleaning the semiconductor wafer in the dilute hydrofluoric acid/hydrogen peroxide/hydrogen chloride bath but before the step of cleaning the semiconductor wafer in the second ozone bath, the semiconductor wafer is transferred to a second overflow bath for further cleaning.

9. The cleaning method of claim 1, wherein the ratio of dilute hydrofluoric acid/hydrogen peroxide/hydrogen chloride ($DHF:H_2O_2:HCl$) in the dilute hydrofluoric acid/hydrogene peroxide/hydrogen chloride bath is between about 0.5:1:1 and 0.1:5:5.

10. The cleaning method of claim 1, wherein after the step of cleaning the semiconductor wafer in the second ozone bath, the semiconductor wafer is transferred into a drying bath to remove moisture present on the semiconductor wafer.

11. The cleaning method of claim 10, wherein isopropyl alcohol is used in the drying bath to remove the moisture present on the semiconductor wafer.

* * * * *